United States Patent
Kondo et al.

(10) Patent No.: US 10,667,451 B2
(45) Date of Patent: May 26, 2020

(54) COMPONENT MOUNTER WITH A PUSH FUNCTION

(71) Applicant: FUJI CORPORATION, Chiryu (JP)

(72) Inventors: Tatsue Kondo, Chiryu (JP); Hiromi Suzuki, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 310 days.

(21) Appl. No.: 15/893,371

(22) Filed: Feb. 9, 2018

(65) Prior Publication Data
US 2019/0254202 A1 Aug. 15, 2019

(51) Int. Cl.
*H05K 13/04* (2006.01)
*H05K 13/08* (2006.01)
*H05K 13/00* (2006.01)

(52) U.S. Cl.
CPC ......... *H05K 13/08* (2013.01); *H05K 13/0069* (2013.01); *H05K 13/041* (2018.08); *H05K 13/0408* (2013.01); *H05K 13/0409* (2018.08)

(58) Field of Classification Search
CPC .......... H05K 13/0069; H05K 13/0408; H05K 13/0409; H05K 13/041; H05K 13/08
See application file for complete search history.

(56) References Cited

U.S. PATENT DOCUMENTS

| | | | |
|---|---|---|---|
| 6,986,196 B2 | 1/2006 | Terui | |
| 7,246,429 B2 * | 7/2007 | Oyama | H05K 13/0413 29/740 |
| 9,699,945 B2 | 7/2017 | Ishitani | |
| 2016/0007514 A1 | 1/2016 | Yamamoto et al. | |

FOREIGN PATENT DOCUMENTS

| | | |
|---|---|---|
| JP | H3-120800 A | 5/1991 |
| JP | H4-364100 A | 12/1992 |
| JP | H7-015181 A | 1/1995 |
| JP | H9-046095 A | 2/1997 |
| JP | 3338719 B2 * | 10/2002 |
| JP | 2003-008293 A | 1/2003 |
| JP | 2003008291 A * | 1/2003 |
| JP | 2003-101294 A | 4/2003 |
| JP | 2005-144575 A | 6/2005 |
| JP | 2008-041712 A | 2/2008 |
| JP | 4322534 B2 * | 9/2009 |
| JP | 2010-27661 A | 2/2010 |
| JP | 2011-100800 A | 5/2011 |
| JP | 2011-253869 A | 12/2011 |

(Continued)

*Primary Examiner* — Carl J Arbes
(74) *Attorney, Agent, or Firm* — Oblon, McClelland, Maier & Neustadt, L.L.P.

(57) ABSTRACT

A component mounter including a conveyance device configured to convey a board and hold the board at a specified position; a supply device configured to supply a component; and two mounting units each including a tool rotation device and a component handling tool. The component handling tool includes a base section and a protruding portion extending in a downward direction from the base section, a first end of the protruding portion attached to the base section at a tool attaching position, and a second end of the protruding portion positioned offset with respect to the tool attaching position in a direction perpendicular to the downward direction. The component mounter uses the component handing tools to simultaneously push a component at two push locations so as to insert the component onto the board.

8 Claims, 10 Drawing Sheets

(56) References Cited

FOREIGN PATENT DOCUMENTS

| | | |
|---|---|---|
| JP | 2011-258875 A | 12/2011 |
| JP | 2013-115229 A | 6/2013 |
| JP | 2014-160788 A | 9/2014 |
| WO | 2018/225168 | * 12/2018 |

* cited by examiner

COMPONENT MOUNTER WITH A PUSH FUNCTION

FIELD OF THE DISCLOSURE

The present application relates to a component mounter, more specifically a component mounter with a push function for pushing a component downward on a circuit board after mounting the component on the circuit board.

DESCRIPTION OF THE RELATED ART

Component mounters that pick up, transport, and mount components (e.g., electrical connectors, chips, or the like) on circuit boards are often employed to increase productivity.

However, for certain types of components, such as connectors with connection leads protruding from a bottom surface and/or connectors having large dimensions, the component mounters are often unable to sufficiently secure the connector to the board. While Published Patent Application JP 2011-253869A ("JP '869") discusses a few features intended to assure that a component is securely mounted on a board during a push function, that publication identifies limited functionality for component mounters, notably for use in mounting different types of components.

For example, JP '869 discusses two mounting units each having a handling tool that simultaneously pushes, for example, a larger component at two locations, or, in the alternative, pushes the larger component at each of the two locations one after the other using a single component handling tool.

With conventional component mounters such as shown in JP '869, the distance (pitch) between the pair of component mounting tools is fixed. Thus, the locations at which a component can be pushed simultaneously are limited and consequently the types of components that can be manipulated are limited. Further, in order to push simultaneously at two locations with a distance provided between the two locations varied, it is necessary to adjust the attachment position of the mounting units or the component handling tools, increasing the complexity of the mounting unit and setup time.

SUMMARY

A component mounter solving the aforementioned problems of adaptability is desired. To solve the above problems, the inventors propose a component mounter including:

a conveyance device configured to convey a board and hold the board at a specified position;

a supply device configured to supply a component; and two mounting units each including a tool rotation device and a component handling tool, the component handling tool including a base section and a protruding portion extending in a downward direction from the base section, a first end of the protruding portion attached to the base section at a tool attaching position, and a second end of the protruding portion positioned offset with respect to the tool attaching position in a direction perpendicular to the downward direction.

As a consequence of this configuration, the distance (pitch) between the second ends of the component handling tools can be changed. Therefore, it is possible to perform a push operation at two locations wherein the distance (pitch) between the two locations can be varied without increasing the complexity of the component mounter.

DETAILED DESCRIPTION

Figure 1:
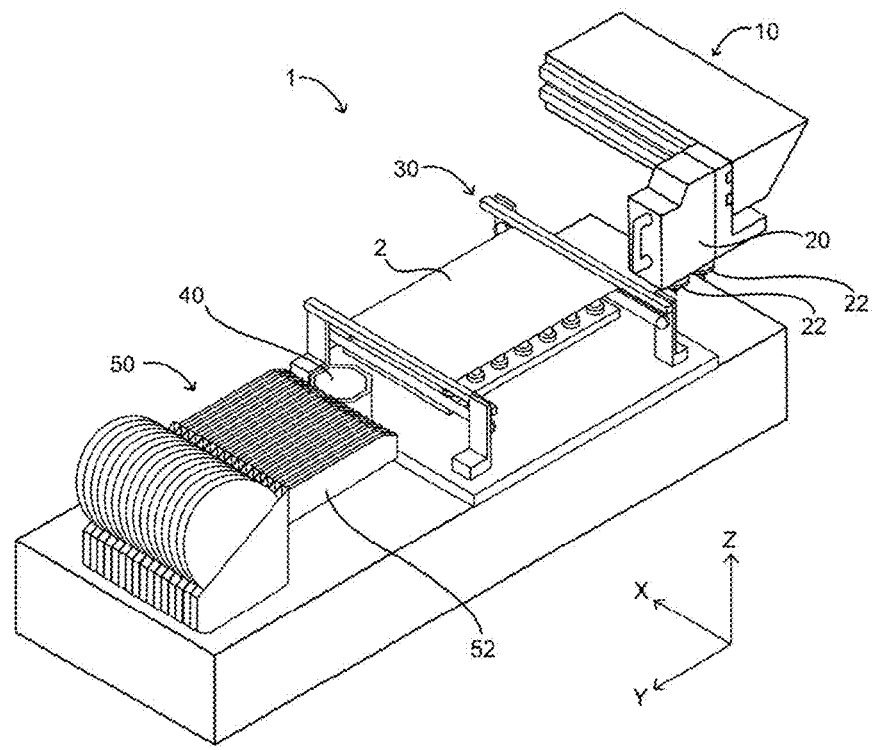
FIG. 1 is a perspective view of a component mounter, according to certain aspects of the disclosure.

All publications, patent applications, patents, and other references mentioned herein are incorporated by reference in their entirety. Further, the materials, methods, and examples discussed herein are illustrative only and are not intended to be limiting. In the drawings, like reference numerals designate identical or corresponding parts throughout the several views. Further, as used herein, the words "a", "an", and the like include a meaning of "one or more", unless stated otherwise. The drawings are generally drawn not to scale unless specified otherwise or illustrating schematic structures or flow charts.

FIG. 1 is a perspective view of a component mounter 1, according to certain aspects of the disclosure. Component mounter 1 mounts components onto board 2 and is provided with an XY robot 10, head 20, conveyor 30, camera 40, supply device 50, and so on. In addition, the component mounter 1 can include machines such as Surface Mount Technology (SMT) mounters, and insertion machines that insert components such as axial and radial components.

Figure 2:
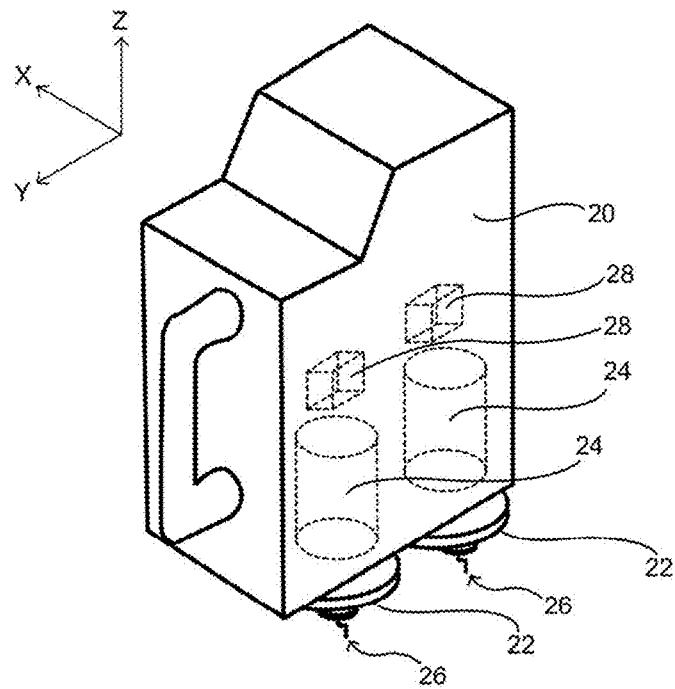
FIG. 2 is a perspective view of a head provided with two mounting units, according to certain aspects of the disclosure.

FIG. 2 is a perspective view of a head 20, according to certain aspects of the disclosure. The head 20 is mounted on the XY robot 10 and is moved in X and Y directions (as labelled in the figures) by the XY robot 10. As shown in FIG. 2, head 20 is provided with two sets of mounting units 22, tool rotation devices 24, and Z-axis motors 28. Each mounting unit 22 includes a component handling tool 26. The tool rotation devices 24 rotate component handling tools 26, and the Z-axis motors 28 move component handling tools 26 in a vertical direction (the Z direction in FIG 1).

Figure 3:
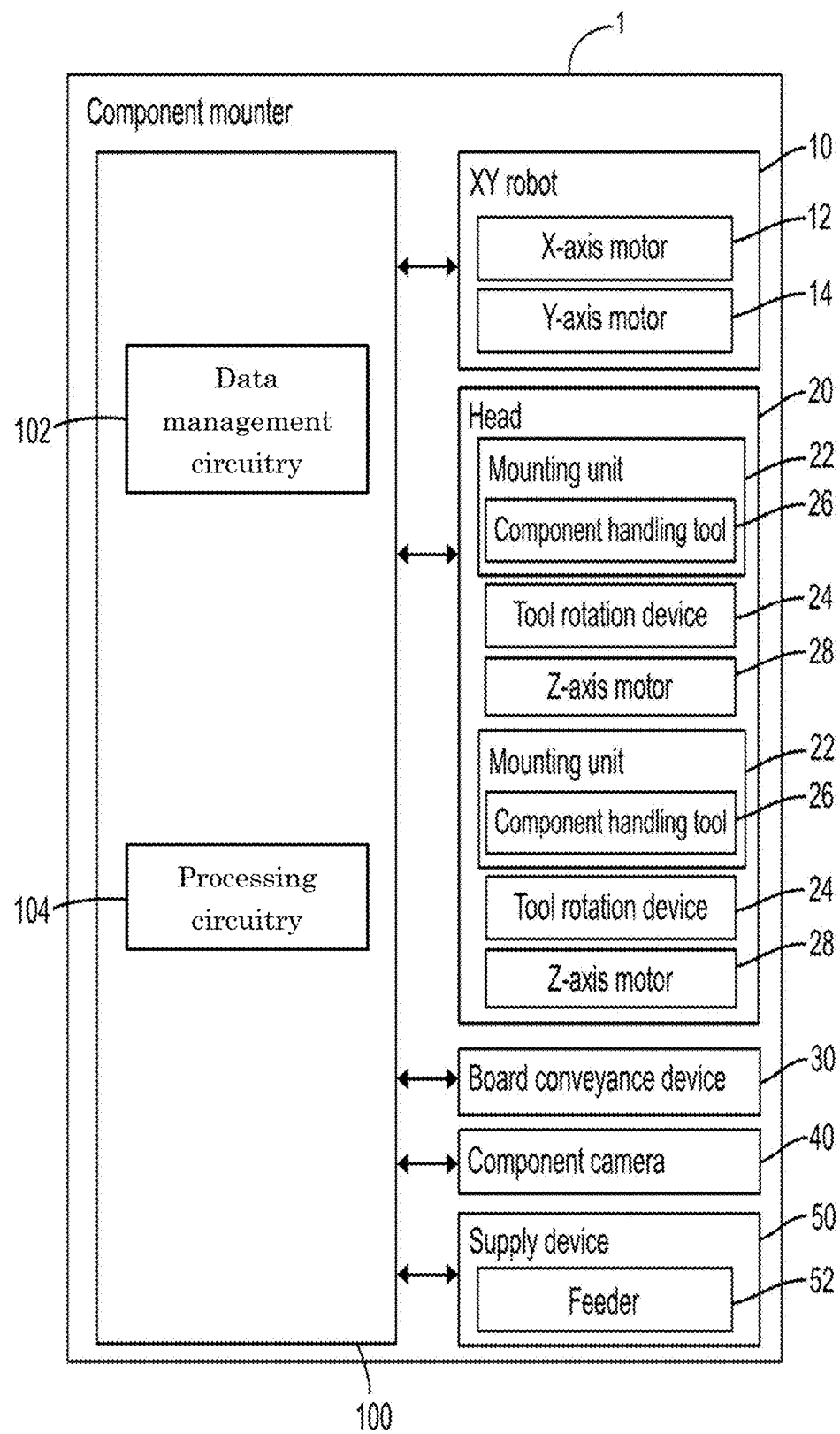
FIG. 3 is a block diagram showing control circuitry of the component mounter, according to certain aspects of the disclosure.

FIG. 3 is a block diagram showing control circuitry 100 of the component mounter 1, according to certain aspects of the disclosure. As shown in FIG. 3, the XY robot 10 includes an X-axis motor 12 and a Y-axis motor 14 for moving the XY robot 10. The tool rotation device 24 rotates the component handling tool 26. The component mounter 1 is conventionally provided with tool rotation device 24 for correcting the orientation of a component before mounting or insertion. Here, the tool rotation device 24 is also used to rotate the component handling tool 26 prior to a push operation (details described below).

Supply device 50 includes feeders 52 shown here as tape feeders, but may include other component feeders such as tray feeders, axial feeders, radial feeders, stick feeders, and so on.

The component mounter 1 is also provided with control circuitry 100 that includes a data management section 102 and processing circuitry 104. Control circuitry 100 may be configured from a conventional computer.

Figure 4:
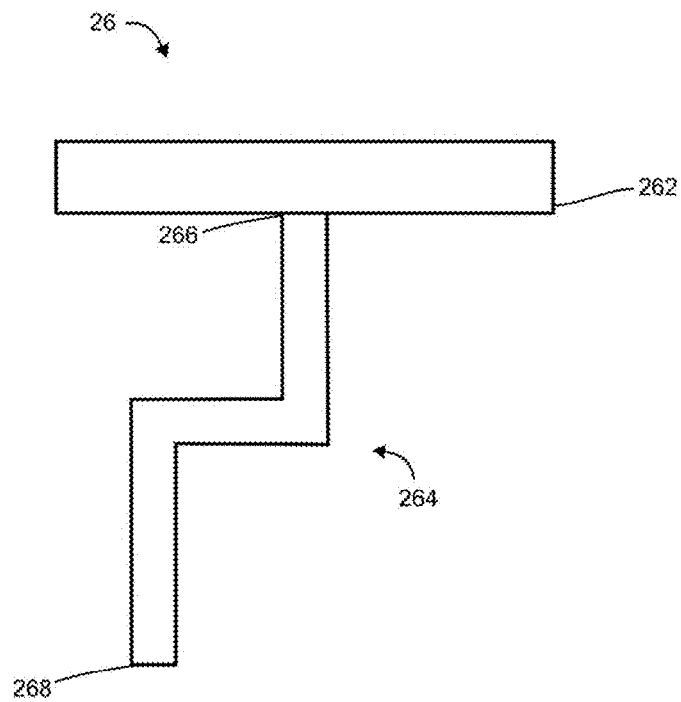
FIG. 4 is a side view of a component handling tool, according to certain aspects of the disclosure.
Figure 5:
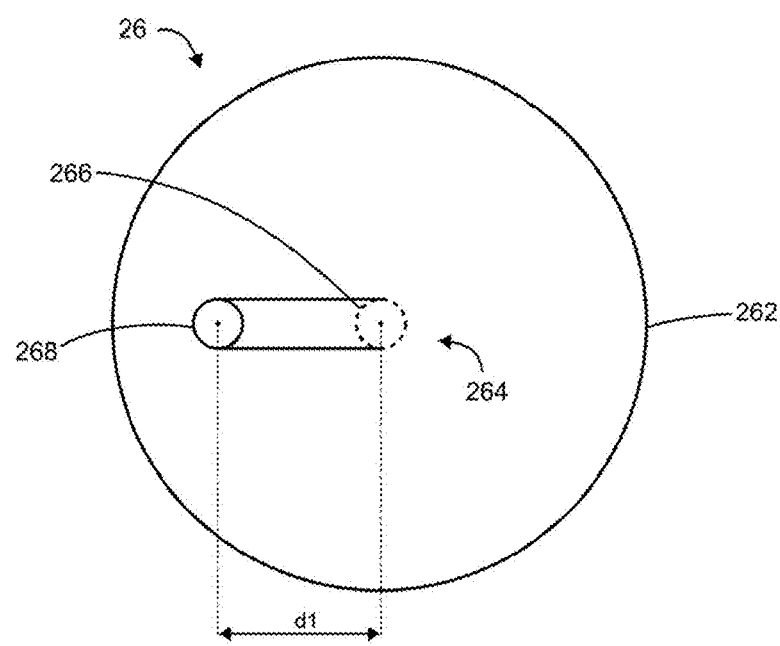
FIG. 5 is a bottom view of the component handling tool, according to certain aspects of the disclosure.

FIGS. 4 and 5 are side and top views of the component handling tool 26, according to certain aspects of the disclosure. The component handling tool 26 includes a base section 262, a first end 266, and a second end 268. The component handling tool 26 is a multi-purpose working tool for mounting a component on a board. Its purposes include picking up the component, transporting the component, mounting or inserting the component on the board, and pushing the component into the board after mounting or insertion is complete. The component handling tool 26 may be, for example, a suction nozzle that picks up and mounts a component on a board using suction, a clamping tool that picks up and mounts a component on a board by clamping the component from the sides, or a pushing tool that pushes a component after the component has been mounted or inserted.

As shown in FIGS. 4 and 5, a protruding portion 264 protrudes downwards from base section 262. The first end 266 of the protruding portion 264 is attached to the base section 262 at a tool attaching position. The protruding portion 24 has an intermediate portion forming substantially right angles with the first end 266 and the second end 268, respectively, such that the second end 268 of the protruding portion 264 still extends downward. This configuration results in the second end 268 of the protruding portion 264 positioned offset with respect to the tool attaching position in a direction perpendicular to the downward direction. This offset is shown in FIG. 5 as distance d1. The importance of this offset when performing the push operation is described in detail below. Note that the component handling tool 26 can have various configurations, but forming the protruding portion 264 with the intermediate portion forming substantially right angles with the first and second ends is easier from a point of view of manufacturing the component handling tool 26.

Figure 6:
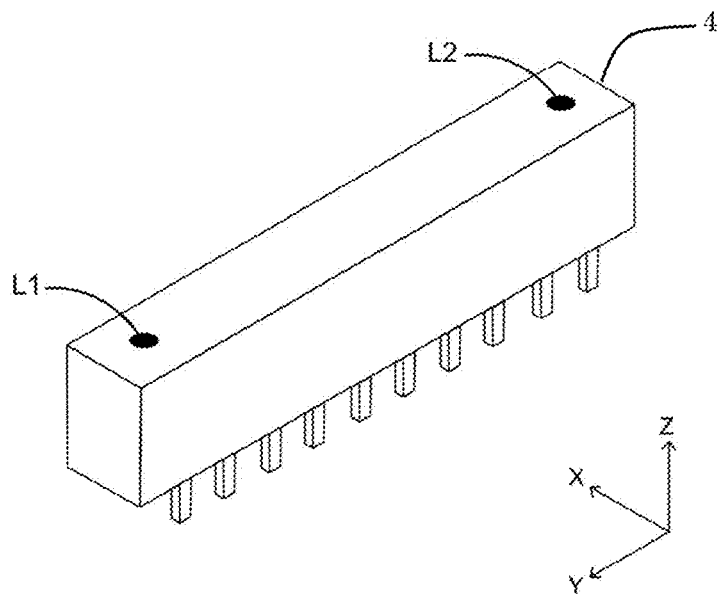
FIG. 6 is a perspective view of a component with push locations, according to certain aspects of the disclosure.
Figure 7:
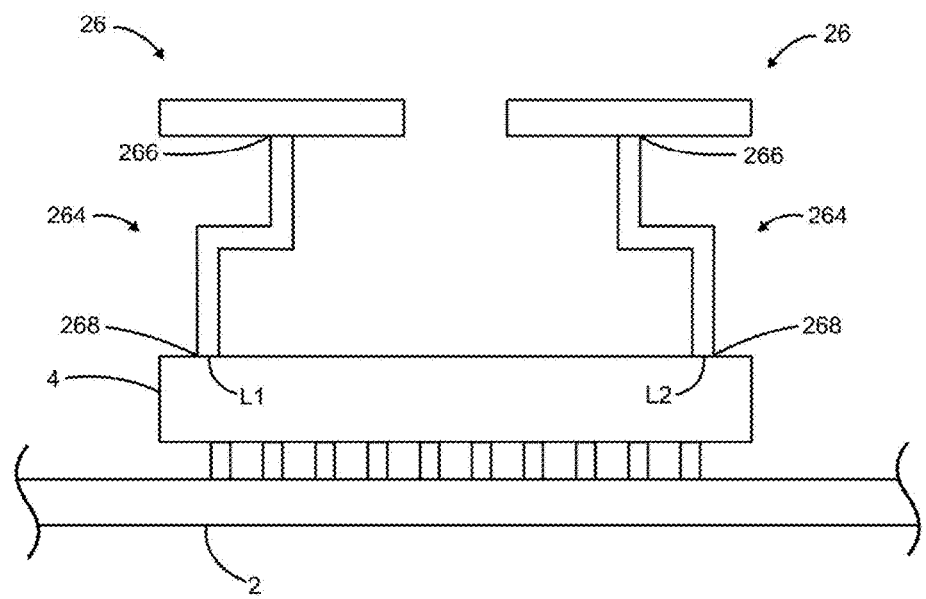
FIG. 7 is a side view of the component handling tool pushing the component, according to certain aspects of the disclosure.

FIG. 6 is a perspective view of an exemplary component 4 with push locations L1, L2, according to certain aspects of the disclosure. The component 4 has elements (leads) protruding from the bottom surface of the component. These leads are to be inserted into holes (not shown) of board 2. The push locations L1 and L2 are located on a top surface of the component 4 substantially close to each end of the component, have a length measured from each end of between 1% and 25% of a total length of the component. After the component 4 has been mounted to board 2, the component 4 is pushed at the push locations L1 and L2 so as to secure the component 4 to the board 2. FIG. 7 is a side view of the component handling tool 26 pushing the component 4, according to certain aspects of the disclosure. The two component handling tools 26 are configured to push the component 4 simultaneously at the locations L1 and L2.

Specifically, the second ends 268 of each of the two component handling tools 26 push at locations L1 and L2, respectively. The push operation is performed by component handling tool 26 being lowered by the Z-axis motor 28 (see FIG. 2).

Figure 8A:
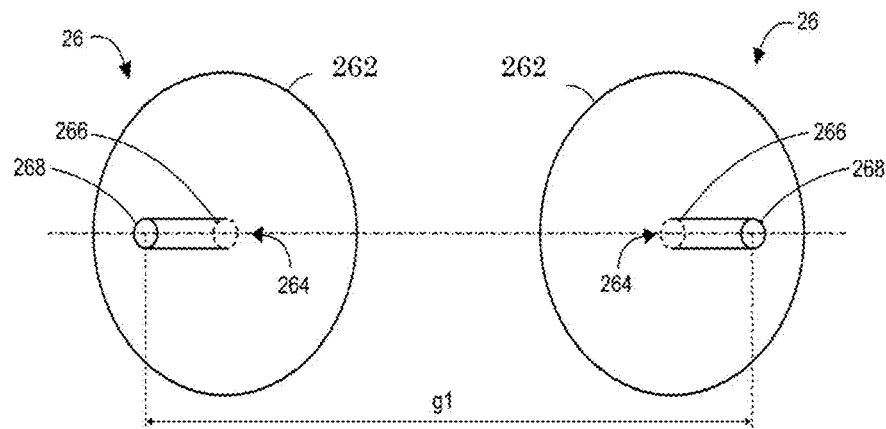
FIG. 8A is a bottom view of the component handling tools providing a first distance, according to certain aspects of the disclosure.
Figure 8B:
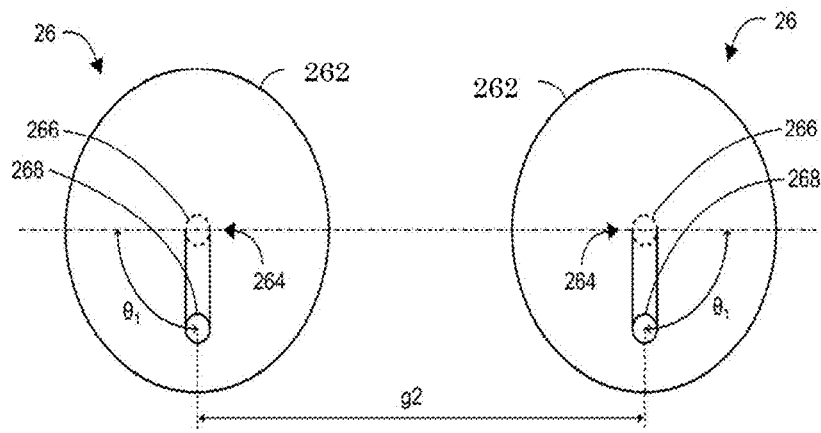
FIG. 8B is a bottom view of the component handling tools providing a second distance, according to certain aspects of the disclosure.
Figure 8C:
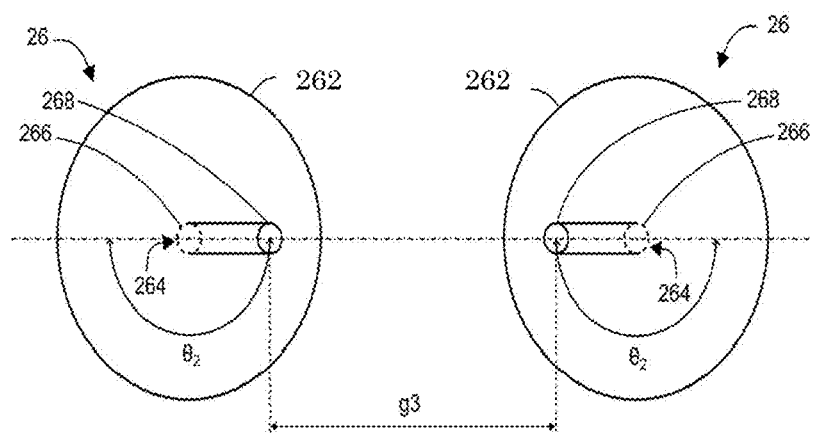
FIG. 8C is a bottom view of the component handling tools providing a third distance, according to certain aspects of the disclosure.

FIGS. 8A-8C are top views of the component handling tools 26 illustrating a first distance g1, a second distance g2, and a third distance g3, respectively, between the second ends 268 according to certain aspects of the disclosure. FIGS. 8A-8C illustrate a rotation of component handling tools 26 to change the distance (pitch) between the second ends 268 of protruding portions 264. The rotation allows the component handling tools 26 to push a component simultaneously at two push locations, and to vary the distance between the two push locations.

For example, FIG. 8A illustrates a case in which the push locations are separated by a first distance g1. Thanks to the offset of second ends 268 (refer to FIG. 5), by rotating the two component handling tools 26 to the positions shown, the gap between the second ends 268 of the two component handling tools 26 is g1. This means a component can be pushed simultaneously at the two push locations separated by the first distance g1. FIG. 8B illustrates a case in which the push locations are separated by the second distance g2. Similar to above, by rotating the two component handling tools 26 by angle $\theta_1$ as shown, the gap between the second ends 268 of the two component handling tools 26 is g2. This means a component can be pushed simultaneously at the two push locations separated by the second distance g2. Further, FIG. 8C illustrates a case in which the push locations are separated by the third distance g3. Again, by rotating the two component handling tools 26 by angle $\theta_2$ as shown, the gap between the second ends 268 of the two component handling tools 26 is g3. This means a component can be pushed simultaneously at two push locations separated by the third distance g3. As is clear from FIGS. 8A-8C, varying the rotation angle $\theta$ of each of the component handling tools 26 permits the length of the gap between the second ends to be varied between the first distance g1, a maximum length, and the third distance g3, a minimum length. Thus, it is possible to vary the distance between the two locations that can be pushed simultaneously by the two component handling tools 26.

Next, operation of the component mounter 1 is described in more detail. The component mounter 1 performs mounting operation according to a production task that includes determining and/or calculating key data, such as mounting locations of components, movement speeds for the XY robot 10, tool offset amounts of the component handling tools 26 (representing the distance from the tool attaching position to the position of the second end 268 of the protruding portion 264), and push locations (representing positions at which a component should be pushed). This data may be entered by an operator in advance and stored in the data management circuitry 102 of control circuitry 100.

During the mounting operation, control circuitry 100 actuates the XY robot 10 such that head 20 is above the supply device 50. Control circuitry 100 then actuates the component handling tool 26 to pick up a component from the feeder 52 of the supply device 50 and move the component above the component camera 40.

The component camera 40 captures images of the component. The images are then processed in order to correct the position of the component during mounting through software instructions performed by the control circuitry 100. The control circuitry 100 actuates the handling tool 26 to mount the component on the board 2 at a specified mounting location. Further, based on the tool offset amounts and the push location data stored in the data management section 102, processing circuitry 104 of control circuitry 100 calculates a rotation amount (angle θ) for each component handling tool 26. Subsequently, according to the rotation amount (angle θ) calculated by processing circuitry 104, control circuitry 100 actuates the tool rotation devices 24 to rotate component handling tools 26 by the rotation amount (angle θ), and then the control circuitry 100 actuates the Z-axis motors 28 to lower the component handling tools 26 so as to push the component simultaneously at the push locations stored in the data management circuitry 102. This completes mounting operation of one component.

Figure 9A:
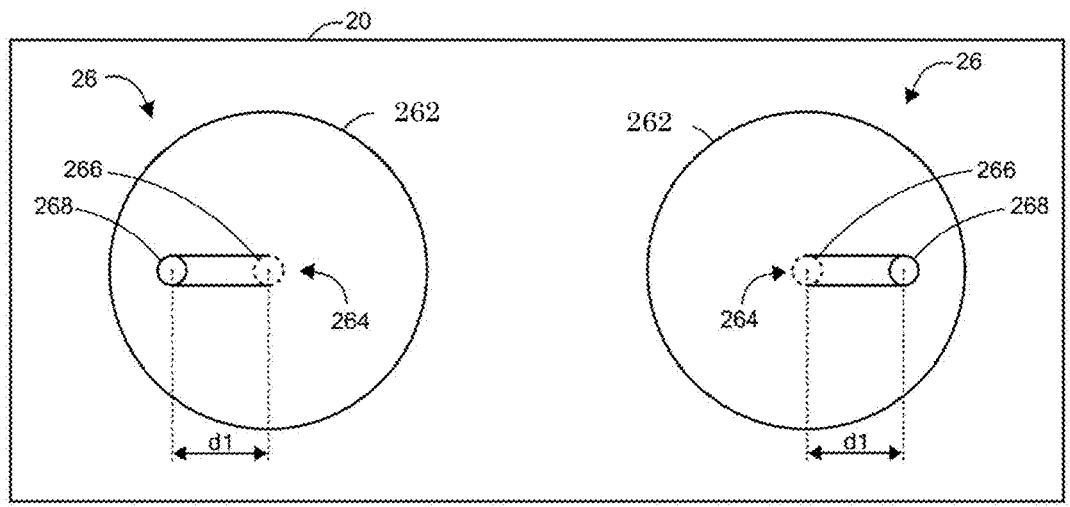
FIGS. 9A and 9B are bottom views of the component mounter in an alternative configuration, according to certain aspects of the disclosure.
Figure 9B:
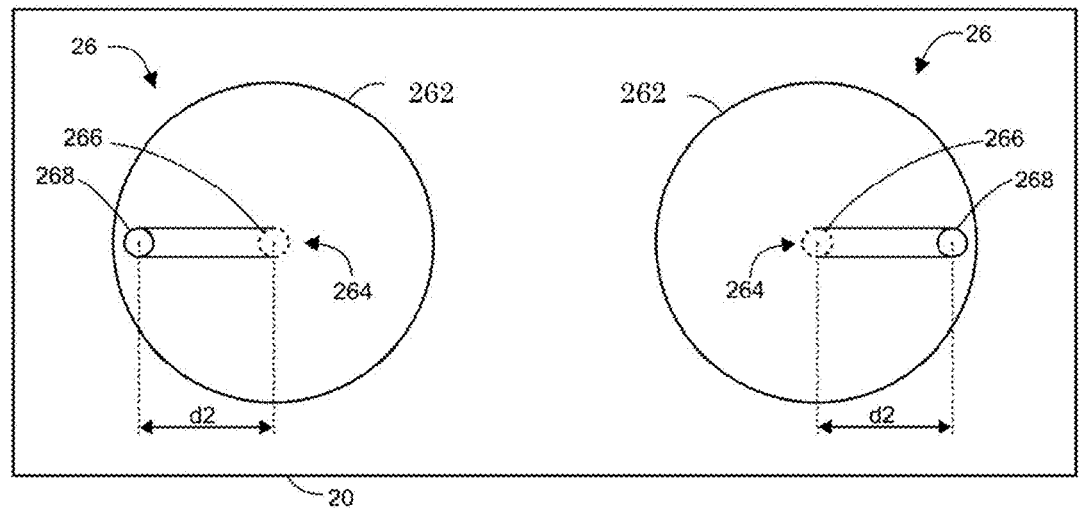

FIGS. 9A and 9B are top views of the component mounter in an alternative configuration, according to certain aspects of the disclosure. FIGS. 9A and 9B illustrate a case in which there are first and second mounting heads 20, each provided with two mounting units 22 (refer to FIGS. 2 and 3), and mounted in component mounter 1 side-by-side at a fixed relative position. FIGS. 9A and 9B show the component mounting tools 26 of each mounting unit 22 from below. The second ends 268 of the component mounting tools 26 of the first head 20 have an offset of d1. The second ends 268 of the component mounting tools 26 of the second head 20 has an offset of d2. As can be understood from the figures, rotating each of the component mounting tools 26 independently allows for a greater variability of the distance between the locations (i.e., gaps) to be pushed simultaneously by the component mounter 1 without having to adjust the attachment position of the mounting units 22 or the component handling tools 26. In this case, similar to above, data regarding the tool offset amounts of component handling tools 26 and so on is stored in the data management section 102, and independent control of each component handling tool 26 is performed by control circuitry 100 based on calculations made by the processing circuitry 104. This configuration also allows a component to be pushed simultaneously at more than two push locations.

Figure 10:
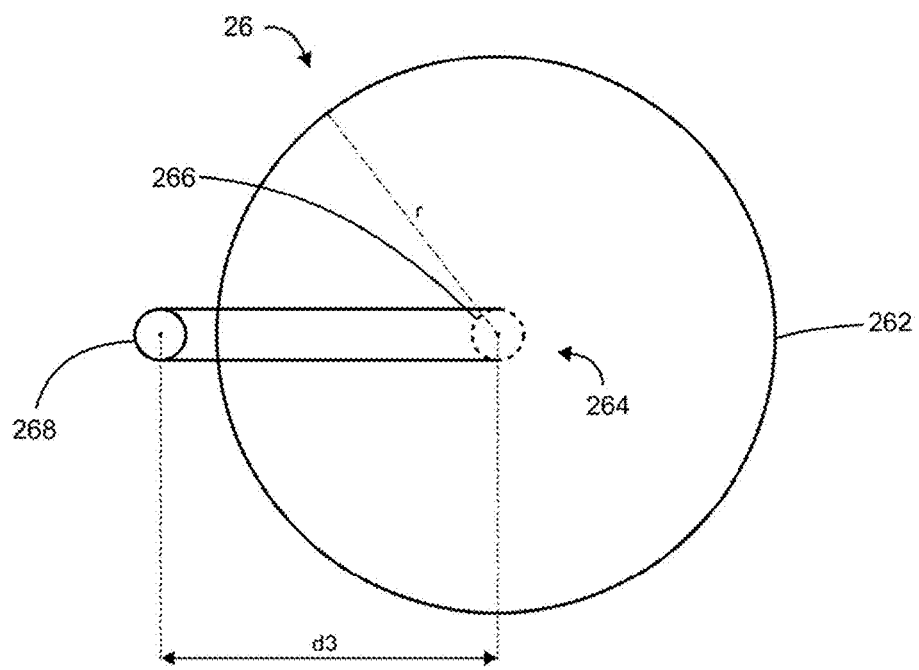
FIG. 10 is a bottom view of the component holding tool in a first alternative configuration, according to certain aspects of the disclosure.

FIG. 10 is a top view of the component holding tool 26 in a first alternative configuration, according to certain aspects of the disclosure. FIG. 10 shows a first alternative configuration for the component holding tool 26 in which the tool offset amount (d3) is greater than the radius r of base section 262. Such a configuration extends the range of possible sets of locations that can be pushed simultaneously. The only restriction to this configuration is that the offset amount must not be set such that the component holding tools 26 interfere with each other or other items provided in the component mounter 1 when being rotated.

Figure 11A:
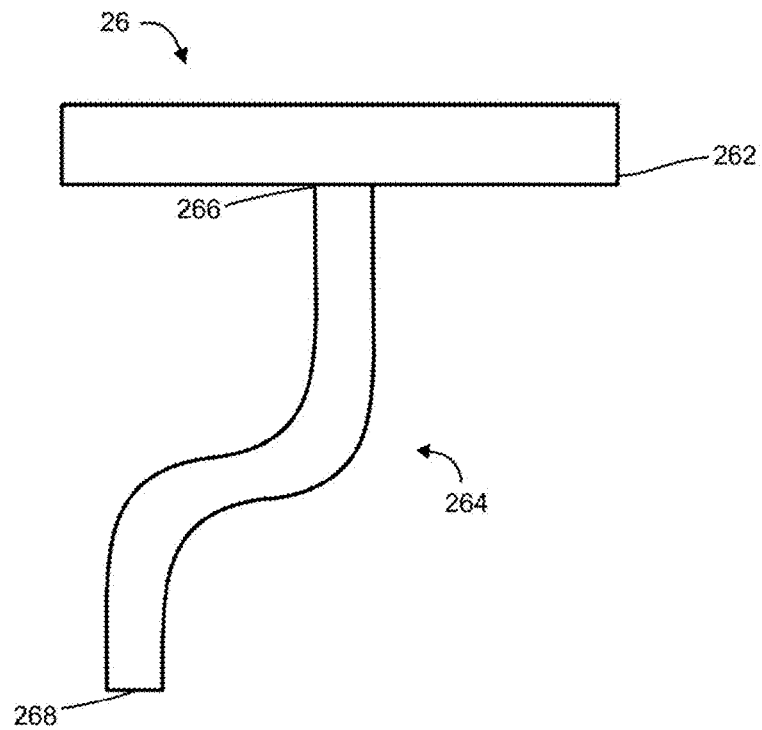
FIG. 11A is a side view of the component holding tool in a second alternative configuration, according to certain aspects of the disclosure.
Figure 11B:
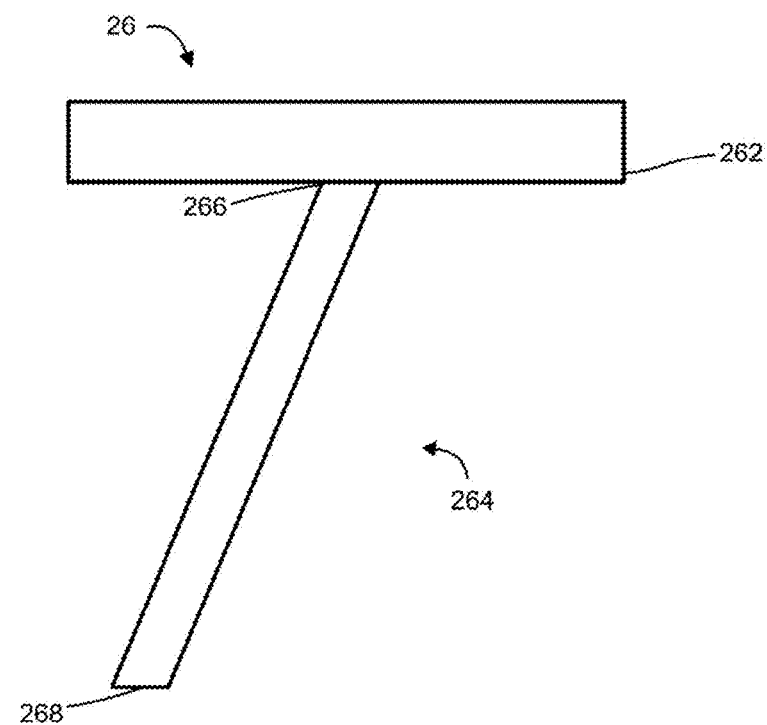
FIG. 11B is a side view of the component holding tool in a third alternative configuration, according to certain aspects of the disclosure.

FIGS. 11A-11B are side views of the component holding tool 26 in a second alternative configuration and in a third alternative configuration, according to certain aspects of the disclosure. FIG. 11A shows the protruding portion 264 as curved at an intermediate portion, while FIG. 11B shows the protruding portion 264 as protruding downwards at a predetermined angle. According to these alternative embodiments, it is still possible to perform a push operation at multiple locations simultaneously wherein the distance separating the push locations can be varied without increasing the complexity of the component mounter 1.

Figure 12:
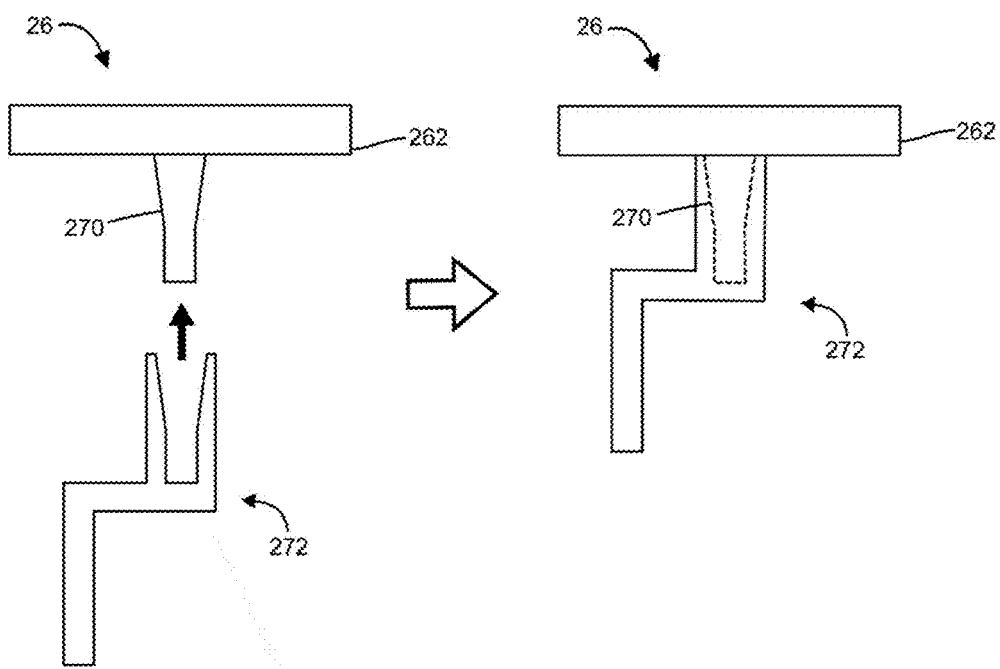
FIG. 12 is a side view of the component holding tool with a nozzle section, according to certain aspects of the disclosure.

FIG. 12 is a side view of the component holding tool 26 with a nozzle section 270, according to certain aspects of the disclosure. FIG. 12 shows the component holding tool 26, wherein the protruding portion is formed as a nozzle section attachment 272 that fits onto a nozzle section 270 in a case in which the component handling tool 26 is a suction nozzle. Nozzle section attachment 272 is attachable and removable with respect to the nozzle section 270. This may be achieved by use of, for example, clipping attachments (not shown) at attachment interface surfaces. With this configuration, a standard suction nozzle can be easily modified to become the component handling tool 26 used to push the component 4 at two locations simultaneously.

Figure 13:
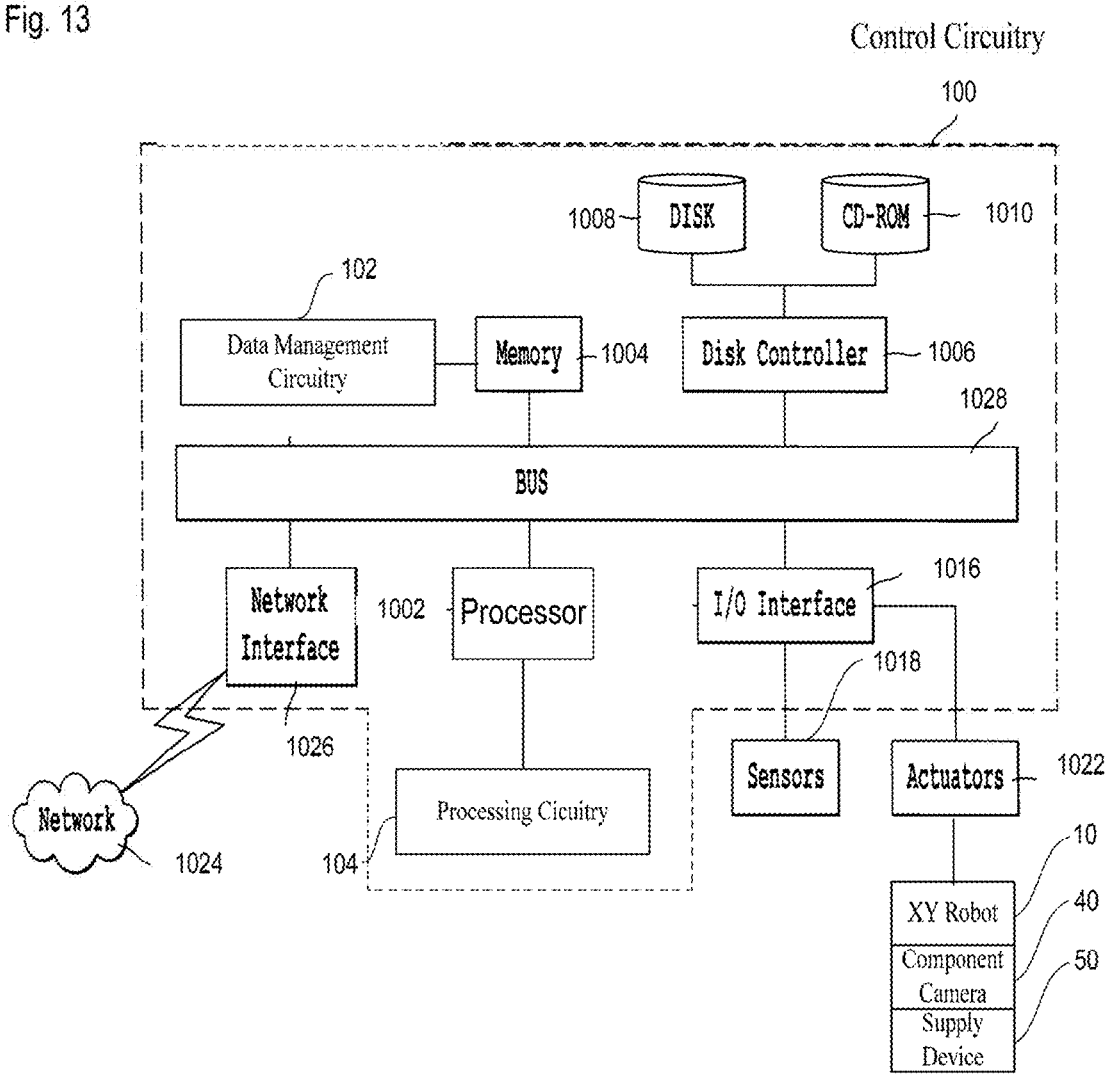
FIG. 13 is a schematic view of a hardware diagram of control circuitry configured to control the component mounter, according to certain aspects of the disclosure.

FIG. 13 is a schematic view of a hardware diagram of the control circuitry 100 configured to control the component mounter 1. As shown in FIG. 13, systems, operations, and processes in accordance with this disclosure may be implemented using a processor 1002 or at least one application specific processor (ASP). The processor 1002 may utilize a computer readable storage medium, such as a memory 104 (e.g., ROM, EPROM, EEPROM, flash memory, static memory, DRAM, SDRAM, and their equivalents) that is operatively coupled with the data management circuitry 104, configured to control the processor 1002 to perform and/or control the systems, operations, and processes of this disclosure. Other storage mediums may be controlled via a disk controller 1006, which may control a hard disk drive 1008 or optical disk drive 1010.

The processor 1002 or aspects thereof, in an alternate embodiment, can include or exclusively include a logic device for augmenting or fully implementing this disclosure, and/or to be operatively coupled to the processing circuitry 104. Such a logic device includes, but is not limited to, an application-specific integrated circuit (ASIC), a field programmable gate array (FPGA), a generic-array of logic (GAL), and their equivalents. The processor 1002 may be a separate device or a single processing mechanism. Further, this disclosure may benefit form parallel processing capabilities of a multi-cored processor.

Additionally, the control circuitry 100 may include an I/O (input/output) interface 1016, provided for inputting sensor data from sensors 1018 and for outputting orders to actuators 1022, e.g. the XY robot 10, the component camera 40, and/or the supply device 50. The sensors 1018 and actuators 1022 are illustrative of any of the sensors and actuators described in this disclosure.

Further, other input devices may be connected to an I/O interface 1016 as peripherals or to provide additional functionality and configuration options, or to control display characteristics. Actuators 1022 which may be embodied in any of the elements of the apparatuses described in this disclosure may also be connected to the I/O interface 1016.

The above-noted hardware components may be coupled to the network 1024, such as the Internet or a local intranet, via a network interface 1026 for the transmission or reception of data, including controllable parameters to a mobile device. A central BUS 1028 may be provided to connect the above-noted hardware components together, and to provide at least one path for digital communication there between.

The foregoing discussion discloses and describes merely exemplary embodiments of an object of the present disclosure. As will be understood by those skilled in the art, an object of the present disclosure may be embodied in other specific forms without departing from the spirit or essential characteristics thereof. Accordingly, the present disclosure is intended to be illustrative, but not limiting of the scope of an object of the present disclosure as well as the claims.

Numerous modifications and variations on the present disclosure are possible in light of the above teachings. It is therefore to be understood that within the scope of the appended claims, the disclosure may be practiced otherwise than as specifically described herein.

REFERENCE SIGNS LIST

1: component mounter
2: board
4: connector
10: XY robot
12: X-axis motor
14: Y-axis motor
20: head
22: mounting unit
24: tool rotation device
26: component handling tool
262: base section
264: protruding portion
266: first end
268: second end
270: nozzle section
272: nozzle section attachment (protruding portion)
28: z-axis motor
30: conveyor
40: component camera
50: supply device
52: feeder
100: control device
102: data management section
104: processing circuitry
G1: gap 1
G2: gap 2
G3: gap 3
$\theta_1$: angle 1
$\theta_2$: angle 2
L1: push location 1
L2: push location 2
r: radius

The invention claimed is:

1. A component mounter comprising:
a conveyance device configured to convey a board and hold the board at a specified position;
a supply device configured to supply a component; and
two mounting units, each mounting unit including
a tool rotation device, and
a component handling tool, the component handling tool including a base section and a protruding portion extending in a downward direction from the base section, the protruding portion including a first end attached to the base section at a tool attaching position and a second end positioned offset with respect to the tool attaching position in a direction perpendicular to the downward direction.

2. The component mounter according to claim 1, wherein: the protruding portion includes an intermediate portion forming substantially right angles with the first end and the second end, respectively, such that the second end of the protruding portion still extends downwards.

3. The component mounter according to claim 1, wherein: the component handling tool is a suction nozzle.

4. The component mounter according to claim 2, wherein: the protruding portion forms a nozzle section attachment that fits onto the component handling tool.

5. The component mounter according to claim 1, wherein: the component handling tool is a clamp.

6. The component mounter according to claim 5, further including:
an end insertable in the component.

7. The component mounter according to claim 1, further comprising:
data management circuitry configured to determine
a tool offset amount commensurate with a distance from the tool attaching position to a position of the second end of the protruding portion and
component push location data commensurate with two push locations at which the component should be pushed;
processing circuitry configured to determine a rotation amount of the component handling tools based on the tool offset amount and the component push location data; and
control circuitry configured to send to the tool rotation device actuation signals to rotate the component handling tools the determined rotation amount and to send actuation signals to the component handling tools to push the component at the determined push locations after the component has been mounted on the board.

8. The component mounter according to claim 7, further comprising:
two heads each provided with the two mounting units, the two heads mounted in the component mounter side-by-side.

* * * * *